US007005873B2

(12) United States Patent
Kim et al.

(10) Patent No.: US 7,005,873 B2
(45) Date of Patent: Feb. 28, 2006

(54) BUILT-IN SELF-TEST HIERARCHY FOR AN INTEGRATED CIRCUIT

(75) Inventors: Llyoung Kim, Plainsboro, NJ (US); Laurence Reeves, Crowthorne (GB); Paul W. Rutkowski, Bridgewater, NJ (US); Jing Wu, North Brunswick, NJ (US)

(73) Assignee: Agere Systems Inc., Allentown, PA (US)

( * ) Notice: Subject to any disclaimer, the term of this patent is extended or adjusted under 35 U.S.C. 154(b) by 333 days.

(21) Appl. No.: 10/335,540

(22) Filed: Dec. 31, 2002

(65) Prior Publication Data

US 2004/0128600 A1 Jul. 1, 2004

(51) Int. Cl.
*G01R 31/26* (2006.01)
(52) U.S. Cl. ........................ 324/765; 324/763; 714/733
(58) Field of Classification Search ............... 324/73.1, 324/759, 763, 765, 158.1; 714/724, 726–733, 714/735
See application file for complete search history.

(56) References Cited

U.S. PATENT DOCUMENTS

| | | | | | |
|---|---|---|---|---|---|
| 5,381,419 | A | * | 1/1995 | Zorian | 714/720 |
| 5,570,374 | A | * | 10/1996 | Yau et al. | 714/733 |
| 5,978,947 | A | * | 11/1999 | Kim et al. | 714/733 |
| 6,237,123 | B1 | * | 5/2001 | Kim et al. | 714/733 |

* cited by examiner

Primary Examiner—Minh N. Tang

(57) ABSTRACT

A built-in, self-test (BIST) network employs a hierarchy of Universal BIST schedulers (UBSs) for scheduling and coordinating testing of elements, such as regular structure BISTed (RSB) elements and random logic BISTed (RLB) elements. Individual UBSs are preferably positioned in local areas, or sections, of an integrated circuit for testing of RSB and RLB elements within the local area. Testing of RSB and RLB elements within the local area allows the BIST network to minimize effects of delay and clock skew by employing relatively short interconnect routing between BISTed elements. Each of the individual UBSs are, in turn, controlled by a master UBS (MUBS) via simplified timing of control signals. The MUBS also may interface with an external testing device that initiates BISTed testing.

15 Claims, 3 Drawing Sheets

AFTER THE COMPLETETION OF THE TEST
P/F: 0- RS PASSED THE BIST
1- RS FAILED THE BIST
S3-0:0000 - SBRIC FINISHED SUCCESSFULLY
-OTHERWISE, SBRIC FAILED

BUILT-IN SELF-TEST HIERARCHY FOR AN INTEGRATED CIRCUIT

BACKGROUND OF THE INVENTION

1. Field of the Invention

The present invention relates to integrated circuits, and, more particularly, to built-in, self-test processing in an integrated circuit.

2. Description of the Related Art

As integrated circuit technology advances, the scale of integration ("density") for the various circuit elements has increased to provide greater functionality from a single semiconductor chip. Circuit elements are predominantly memory elements, sometimes referred to as regular structure (RS) elements, and random logic (RL) elements. RS elements may include RAM, ROM, CAM, FIFO, and embedded core elements, while RL elements comprise digital logic such as AND, XOR, and state machines.

Increasing the density of the various circuit elements also increases the difficulty in testing the operation of the circuit elements by external testing equipment. The increase in testing difficulty is, in-part because of the difficulty in obtaining test-points within the embedded architecture for each of the RS and RL elements. In addition, the increased density increases the time that is required to test the entire chip. Consequently, chip designers are increasingly using "Design for Testability" in their circuit architectures to include built-in self-test (BIST) capability to allow the chip to "test itself" (BISTed test functionality).

However, BISTed test functionality within, for example, Very Large Scale Integrated (VLSI) circuits is complex when implemented. Typically, an interface is provided within the circuit to coordinate communication between an external test controller and various RS and RL elements within the circuit to initiate and schedule BISTed test functions efficiently. U.S. Pat. No. 5,570,374 to Yau et al. ("Yau"), which is incorporated in its entirety herein by reference, describes a network for BIST functionality. In Yau, a controller (termed an "SBRIC") coordinates operation of one or more BISTed elements (RS and RL elements having BIST functionality, termed RSB elements and RLB elements, respectively). In addition, Yau describes a plurality of controllers for RS elements, SBRIC_RSs, coupled in a daisy-chain configuration. The first SBRIC_RS in the chain serves to initiate testing of a first group of RSB elements, the second SBRIC_RS in the chain serves to initiate testing of a second group of RSB elements, and so on through the chain. Each SBRIC_RS in the chain is responsive to a signal generated by the previous SBRIC_RS in the chain to begin testing, and, thus, groups of RSB elements are tested in sequence. Testing in sequence may be required when tests by one SBRIC_RS require data generated during testing of a prior SBRIC_RS.

To increase BIST functionality, U.S. Pat. No. 5,978,947 to Kim et al. ("Kim"), which is incorporated in its entirety herein by reference, describes a token passing network for BIST functionality. In Kim, a Universal BIST Scheduler (UBS) is employed to initiate processing of a group of SBRICs arranged in a matrix. As in Yau, Kim's SBRIC_RSs each coordinate operation of one or more BISTed RS elements (an SBRIC_RL coordinates operation for one or more BISTed RL elements). The UBS schedules operations of multiple SBRIC_RSs concurrently to utilize continuous processing. Arranging the group of SBRICs into a matrix allows the UBS to initiate processing by an SBRIC based upon the SBRIC's position in the matrix to ensure data generated by one SBRIC is available for use by another SBRIC. A token is employed and transferred between SBRICs in the matrix as processing is completed.

In addition, Kim includes a multi-test stage design also employing the scheduling capability of the UBS. During a first test stage, a BISTed test function is implemented for a given RSB element and the results are reflected in test data (termed test signature or signature bits) associated with the RSB element. After the first test stage and before the second test stage, a waiting period for retention testing begins. Retention testing identifies retention faults in the RSB element or the loss of a data value stored in a memory location (cell or word). Retention faults occur from leakage of one or more bits previously written to a memory location. Retention testing requires a waiting period to allow any leakage, if present, to occur. During the second test stage, memory locations of each RSB element are read to test whether, after the waiting period, binary values resulting from BIST testing during the first test stage were retained. In addition, the binary values are toggled to form a complement pattern. After another waiting period, retention testing during the third test stage verifies that the complement pattern is retained. Scheduling by the USB allows for separate processing to occur between test stages and retention testing.

The relatively large size of integrated circuits results in longer interconnect routing lengths between RSB and RSL elements, or groups of RSB and RSL elements. Interconnect routing provides paths for signals, including test signals, between various locations within the integrated circuit. These longer interconnect routing lengths cause increased signal delay and clock skew, especially with global chip signals, such as control signals, in relatively long signal paths throughout the chip.

SUMMARY OF THE INVENTION

In accordance with embodiments of the present invention, a built-in, self-test (BIST) network employs a hierarchy of universal BIST schedulers (UBSs) for scheduling and coordinating testing of elements, such as regular structure BISTed (RSB) elements and random logic BISTed (RLB) elements. Individual UBSs are preferably positioned in local areas, or sections, of an integrated circuit for testing of RSB and RLB elements within the local area Testing of RSB and RLB elements within the local area allows the BIST network to minimize effects of delay and clock skew by employing relatively short interconnect routing between BISTed elements. Each of the individual UBSs are, in turn, controlled by a master UBS (MUBS) via, for example, simplified timing of control signals. The MUBS also may interface with an external testing device that initiates BISTed testing.

In accordance with exemplary embodiments of the present invention, built-in self-test (BIST) testing of BISTed elements in an integrated circuit (IC) is scheduled employing at least two universal BIST schedulers (UBSs), each UBS coupled to one or more BISTed elements and configured to schedule BIST testing for each BISTed element; and a master UBS coupled to each UBS and configured to enable each UBS to perform a BISTed test. The master UBS enables each UBS to perform BIST testing in a predetermined sequence, initiates a wait period at the end of BIST testing, and, when the wait period ends, initiates one or more retention tests.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

In accordance with exemplary embodiments of the present invention, a built-in, self-test (BIST) network employs a hierarchy of universal BIST schedulers (MUBS) for scheduling and coordinating testing of elements, such as regular structure BISTed (RSB) elements and random logic BISTed (RLB) elements. Individual UBSs are preferably positioned in local areas, or sections, of an integrated circuit for testing of RSB and RLB elements within the local area. Testing of RSB and RLB elements within the local area allows the BIST network to minimize effects of delay and clock skew by employing relatively short interconnect routing between BISTed elements. Scheduling and data collection for each of the individual UBSs are, in turn, controlled by a master UBS (MUBS) coordinating timing of control signals to and from UBSs. The MUBS also may interface with an external testing device to receive signals initiating testing and to transfer test data to the external testing device.

As would be apparent to one skilled in the art, the hierarchical structure of UBSs described herein may be extended to a multiple-tier hierarchy. For example, a multiple-tier hierarchy may include groups of UBSs in a third tier that are controlled by corresponding MUBSs in a second tier, and a MUBS in a first tier controls the MUBSs in the second tier. While the following embodiments are described herein for scheduling BISTed test functionality of RSB elements, one skilled in the art may extend the teachings herein to scheduling BISTed test functionality of RLB elements.

Figure 1:
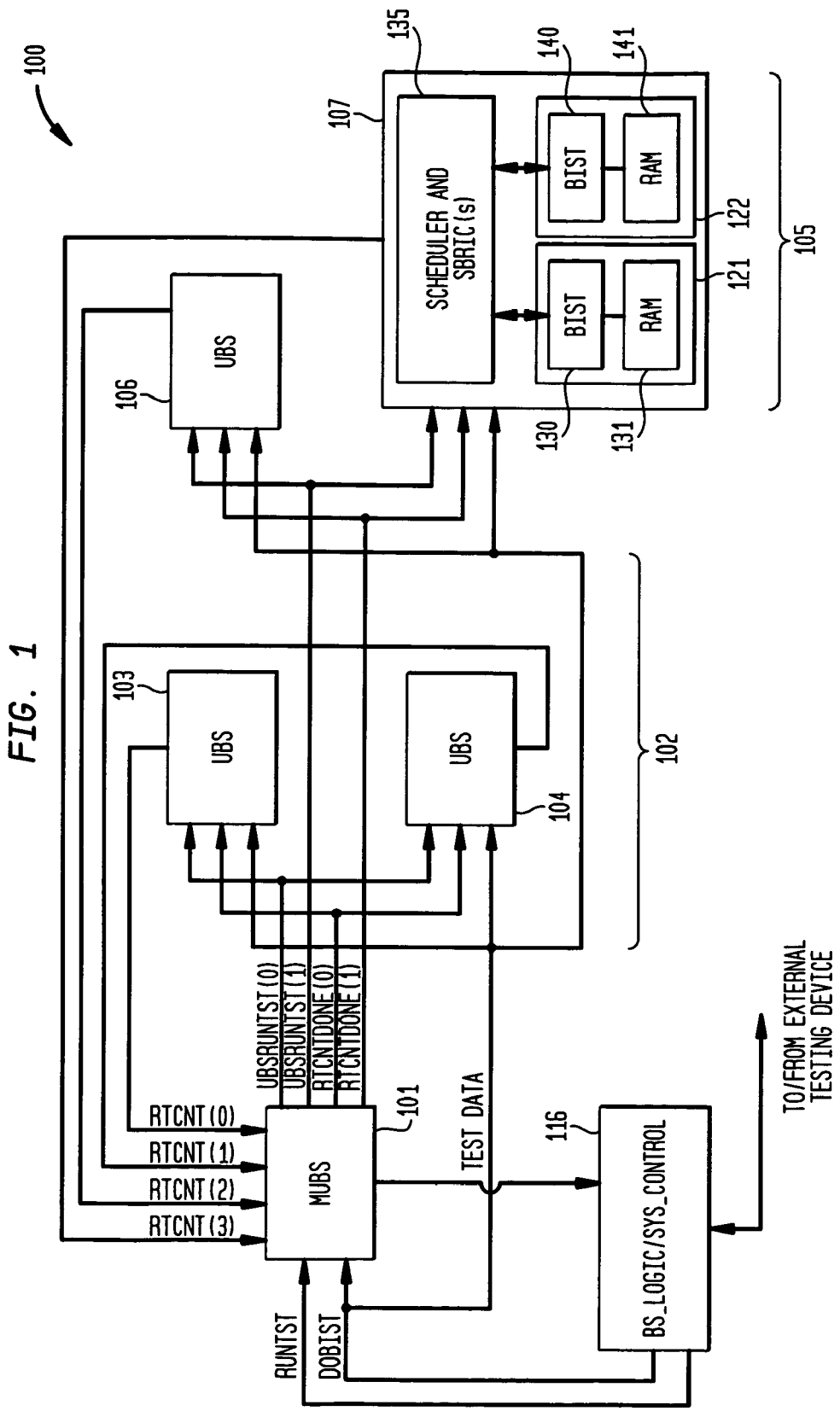
FIG. 1 shows a universal built-in, self-test scheduler (UBS) hierarchy operating in accordance with exemplary embodiments of the present invention.
Figure 2:
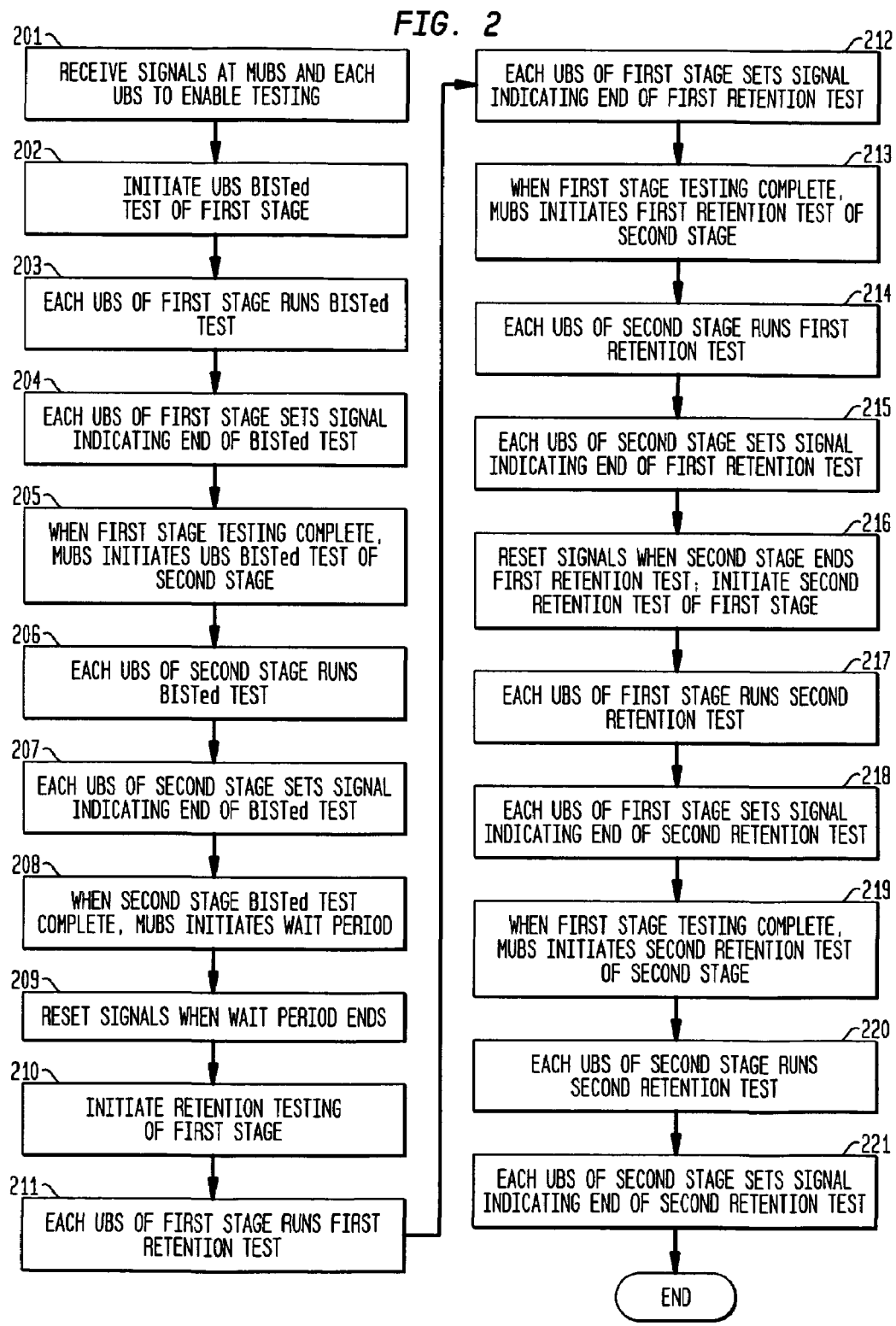
FIG. 2 shows an exemplary method of operation for the UBS hierarchy of FIG. 1.

FIG. 1 shows UBS hierarchy 100 comprising two tiers operating in accordance with exemplary embodiments of the present invention. UBS hierarchy 100 comprises MUBS 101 in the first tier and, in the second tier, first stage 102 having UBSs 103 and 104, and second stage 105 having UBSs 106 and 107. Multiple stages of UBSs such as first and second stages 102 and 105 are desirable for two reasons. First, a BISTed test controlled by one UBS may require the output of a BISTed test controlled by another UBS. Thus, stages may be selected to allow for such sequence of BISTed tests. Second, different stages may be selected based on their relative positions within an integrated circuit. Localized UBSs of a stage may be positioned so as to minimize interconnection distances to minimize clock skew between UBSs of the stage. While FIG. 1 shows two stages of UBSs, each stage having two UBSS, and one skilled in the art may extend the design to one or three or more stages. MUBS 101 is coupled to UBSs 103, 104, 106, and 107. UBS sections 102 and 105 are coupled to MUBS 101 via interconnect routing (bus). UBS hierarchy 100 may include boundary-scan control interface control interface (BS_logic/SYS_control) 116, shown in FIG. 1 coupled to MUBS 101. BS_logic/SYS_control 116 coordinates exchange of control signals and testing data between MUBS 101 and an external testing device (not shown).

Each of UBS stages 102 and 105 shown in FIG. 1 includes two UBSs, though one skilled in the art would realize that one or more than two UBSs may be included in a stage. The UBSs of each stage are preferably positioned relatively close to one another in local areas, or sections, of an IC layout. Each of UBSs 103, 104, 106, and 107 includes a scheduler and one or more BIST controllers (SBRICS) coupled to one or more RSB or RLB elements with corresponding memory. For example, UBS 107 is shown with scheduler and SBRIC (s) coupled to RSB elements 121 and 122. RSB element 121 comprises a BISTed element 130 and random access memory (RAM) 131. Similarly RSB element 122 includes BISTed element 140 and RAM 141. Other elements in UBS may be coupled to RLB elements (not shown in FIG. 1). Operation of UBSs, BISTed functionality, and BISTed testing controlled by a UBS are known in the art. An example of such operation is described in, for example, U.S. Pat. No. 5,978,947 to Kim et al. ("Kim"), which is incorporated in its entirety herein by reference. the MUBS receives signal RUNTST, which initiates BIST testing under control of the MUBS, and the MUBS and each UBS receives signal DOBIST, which enables testing by each BISTed element. Upon receipt of RUNTST and DOBIST, at step 202, the MUBS initiates UBS operation of each UBS in the first stage by setting UBSRUNTST(0).

At step 203, each UBS of the first section runs BISTed testing concurrently until finished. At step 204, each UBS sets its corresponding signal (RTCNT(0), RTCNT(1)) indicating BISTed testing of the UBS is finished. At step 205, when signals RTCNT(0) and RTCNT(1) are both set, the MUBS sets UBSRUNTST(1) to initiate BISTed testing by UBSs of the second stage.

At step 206, each UBS of the second stage runs BISTed testing concurrently until finished. At step 207, each UBS of the second stage sets its corresponding signal (RTCNT(2), RTCNT(3)) indicating BISTed testing of the UBS is finished. At step 208, when signals RTCNT(2) and RTCNT(3) are both set, the MUBS initiates a first wait period.

At step 209, the wait period ends, and signals RTCNT(0) –RTCNT(3) are reset. At step 210, the MUBS sets the signal RTCNTDONE(0), which is provided to each UBS of the first stage. At step 211, in response to RTCNTDONE(0) being set, each UBS of the first stage runs a first retention test, which retention tests run concurrently. At step 212, each UBS of the first stage sets its corresponding signal (RTCNT (0),RTCNT(1)) when finished the first retention test, and in response the MUBS resets RTCNTDONE(0). Once signals RTCNT(0) and RTCNT(1) of the first stage are set, at step 213, the MUBS sets the signal RTCNTDONE(1), which is provided to each UBS of the second stage. At step 214, in response to RTCNTDONE(1) being set, each UBS of the second section runs a first retention test, which retention tests run concurrently. At step 215, each UBS of the second section sets its corresponding signal (RTCNT(2), RTCNT (3)) when finished the first retention test, and in response the MUBS resets RTCNTDONE(1).

At step 216, signals RTCNT(0)–RTCNT(3) are reset, and the MUBS sets the signal RTCNTDONE(0), which is provided to each UBS of the first stage. At step 217, in response to RTCNTDONE(0) being set, each UBS of the first stage runs a second retention test, which retention tests run concurrently. At step 218, each UBS of the first stage sets its corresponding signal (RTCNT(0), RTCNT(1)) when finished the second retention test, and in response the MUBS resets RTCNTDONE(0). Once signals RTCNT(0) and RTCNT(1) of the first stage are set, at step 219, the MUBS sets the signal RTCNTDONE(1), which is provided to each UBS of the second stage. At step 220, in response to RTCNTDONE(1) being set, each UBS of the second stage runs a second retention test, which retention tests run concurrently. At step 221, each UBS of the second stage sets its corresponding signal (RTCNT(2), RTCNT(3)) when finished the second retention test, and in response the MUBS resets RTCNTDONE(1). Once step 221 is complete, the method ends since the BISTed testing operation is complete.

Figure 3:
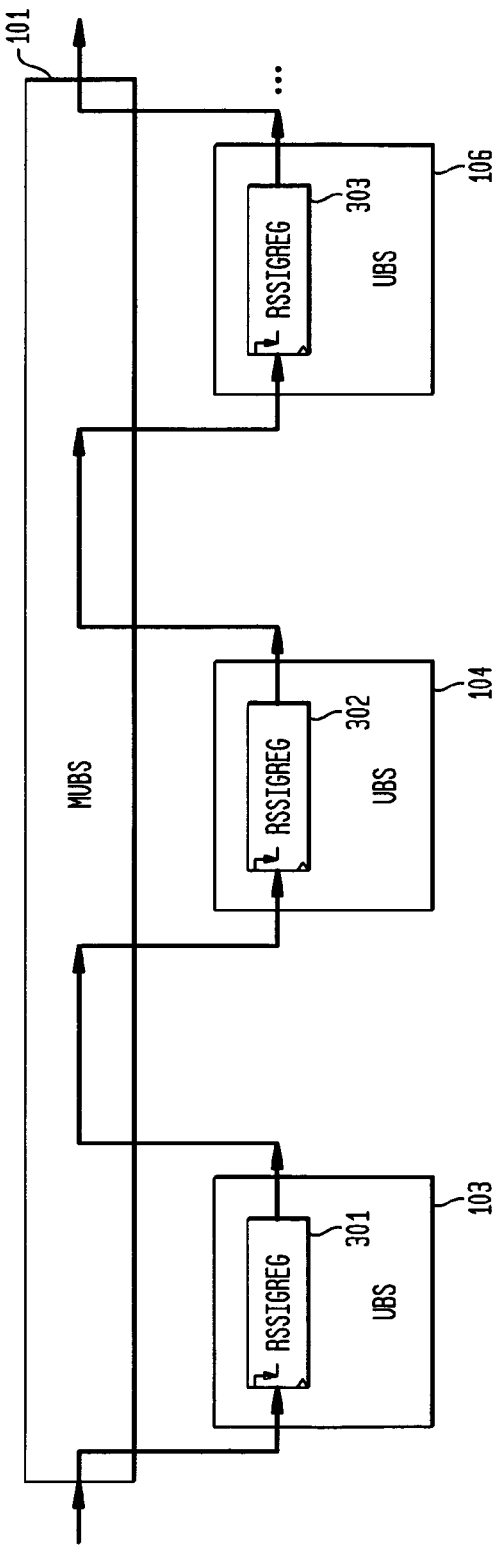
FIG. 3 shows a block diagram of an exemplary configuration for passing test data between UBSs and the master UBS (MUBS) of FIG. 1.
Figure 4:
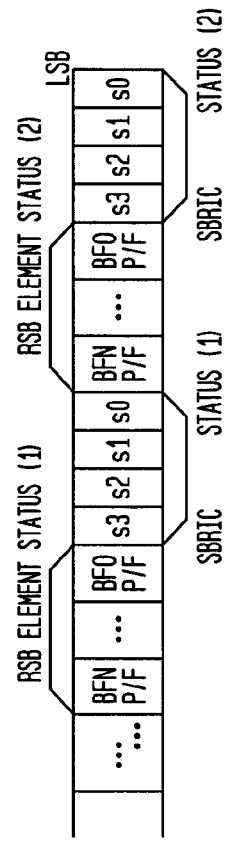
FIG. 4 shows an exemplary serial bit stream for test data collected by the UBSs of FIG. 3.

Returning to FIG. 1, the sequence of BISTed testing, wait period, first retention testing, and second retention testing by each UBS generates test data. Test data may ultimately be provided to an external processor via BS_logic/Sys_control 116. FIG. 3 shows a block diagram of an exemplary configuration for passing test data between UBSs 103, 104, and 106 through MUBS 101. Each of UBSs 103, 104, and 106 includes a module (RSSIGREG 301, 302, and 303, respectively) having a register that collects signature bits from the RSB elements (or RLB elements). The signature bits forming the test data are arranged in a serial bit stream that is passed to and from each of UBSs 103, 104, 106 in sequence by MUBS 101. Such test data may be arranged as a serial stream as shown in FIG. 4. As shown in FIG. 4, the data stream includes groups of signature bits. Each group may comprise one or more sub-groups including an RSB element status (or RLB) element status and SBRIC status. A signature bit of the RSB element status indicates whether the corresponding BISTed element passed or failed the BIST test. A signature bit of the SBRIC status indicates whether the operation of the SBRIC finished successfully or failed.

The present invention can be embodied in the form of methods and apparatuses for practicing those methods. The present invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It will be further understood that various changes in the details, materials, and arrangements of the parts which have been described and illustrated in order to explain the nature of this invention may be made by those skilled in the art without departing from the scope of the invention as expressed in the following claims.

What is claimed is:

1. Apparatus for scheduling built-in, self-test (BIST) testing of BISTed elements, the apparatus comprising:

at least two universal BIST schedulers (UBSs), each UBS coupled to one or more BISTed elements and configured to schedule BIST testing for each BISTed element;

a master UBS (MUBS) coupled to each UBS and configured to enable each UBS to perform a BISTed test, wherein the MUBS enables each UBS to perform BIST testing in a predetermined sequence, initiates a wait period at the end of BIST testing, and, when the wait period ends, initiates one or more retention tests.

2. The apparatus of claim 1, wherein a first stage comprises at least one UBS and a second stage comprises at least one UBS, and wherein:

i) the MUBS enables each UBS in the first stage, and then enables each UBS in the second stage, and ii) when the wait period ends, the MUBS initiates a first retention test in the first stage and then initiates a first retention test in the second stage.

3. The apparatus of claim 2, wherein the at least one UBS at each stage are positioned together in a local region of an integrated circuit (IC).

4. The apparatus of claim 2, wherein the first stage and the second stage are of a plurality of stages, and wherein the MUBS enables BISTed testing of each stage in a predetermined order.

5. The apparatus of claim 1, wherein each BISTed element is either a regular structure BISTed (RSB) element or a random logic BISTed (RLB) element.

6. The apparatus of claim 1, wherein each UBS includes a test signature module configured to receive a serial bit stream and insert one or more signature bits into the serial bit stream, wherein the one or more signature bits represent test data of each BISTed test enabled by the UBS.

7. The apparatus of claim 6, wherein the serial bit stream of one UBS passes through the MUBS before passing to another UBS.

8. The apparatus of claim 1, wherein the apparatus is embodied in a circuit.

9. The apparatus of claim 8, wherein the circuit is embodied in an integrated circuit (IC).

10. The apparatus of claim 1, wherein the MUBS coordinates timing of control signals to and/or from the at least two UBSs.

11. A method of scheduling built-in, self-test (BIST) testing of BISTed elements, the method comprising the steps of:

(a) scheduling, by a master universal BIST scheduler (MUBS), at least two universal BIST scheduler (UBSs) to perform BIST testing, wherein each UBS is coupled to one or more BISTed elements;

(b) enabling, by the MUBS, each UBS to perform BIST testing of the one or more BISTed elements in a predetermined sequence;

(c) initiating, by the MUBS, a wait period at the end of BIST testing, and, (d) initiating, by the MUBS when the wait period ends, one or more retention tests by the UBSs.

12. The method of claim 11, wherein step (b) comprises the steps of:

(b1) scheduling, by each UBS when enabled, BIST testing for each BISTed element; and (b1) enabling, by each UBS when enabled, BIST testing for each BISTed element.

13. The invention method of claim 11, wherein, for step (a), a first UBS is in a first stage and a second UBS is in a second stage, and step (b) comprises the steps of enabling, by the MUBS, the first UBS in the first stage and then enabling the second UBS in the second stage, and step (d) comprises the steps of initiating, by the MUBS when the wait period ends, a first retention test in the first stage and then initiating a first retention test in the second stage.

14. The method of claim 11, wherein the method is embodied in an integrated circuit (IC).

15. The method of claim 11, wherein the MUBS coordinates timing of control signals to and/or from the at least two UBSs.

* * * * *